(12) United States Patent
Ruile et al.

(10) Patent No.: US 9,391,256 B2
(45) Date of Patent: Jul. 12, 2016

(54) ELECTROACOUSTIC TRANSDUCER WITH REDUCED LOSSES DUE TO TRANSVERSE EMISSION AND IMPROVED PERFORMANCE DUE TO SUPPRESSION OF TRANSVERSE MODES

(75) Inventors: Werner Ruile, München (DE); Markus Mayer, Taufkirchen (DE); Ulrike Rösler, Hebertshausen (DE); Markus Hauser, Feldafing (DE); Ingo Bleyl, München (DE); Gerd Riha, Nußdorf (DE); Christoph Eggs, Rattenkirchen (DE)

(73) Assignee: EPCOS AG, Munich (DE)

( * ) Notice: Subject to any disclaimer, the term of this patent is extended or adjusted under 35 U.S.C. 154(b) by 489 days.

(21) Appl. No.: 13/991,148

(22) PCT Filed: Dec. 6, 2011

(86) PCT No.: PCT/EP2011/071900
§ 371 (c)(1),
(2), (4) Date: Aug. 14, 2013

(87) PCT Pub. No.: WO2012/076517
PCT Pub. Date: Jun. 14, 2012

(65) Prior Publication Data
US 2013/0320805 A1    Dec. 5, 2013

(30) Foreign Application Priority Data
Dec. 7, 2010 (DE) .......................... 10 2010 053 674

(51) Int. Cl.
*H03H 9/25* (2006.01)
*H01L 41/047* (2006.01)
(Continued)

(52) U.S. Cl.
CPC ............ *H01L 41/047* (2013.01); *H03H 9/0222* (2013.01); *H03H 9/02858* (2013.01); *H03H 9/02881* (2013.01); *H03H 9/02992* (2013.01);
(Continued)

(58) Field of Classification Search
USPC ....................... 310/313 A–313 D, 313 R, 340; 333/186–188
See application file for complete search history.

(56) References Cited

U.S. PATENT DOCUMENTS 7,132,779 B2 * 11/2006 Kando ....................... 310/313 R
7,453,334 B1    11/2008 Abbott et al.
7,538,637 B2     5/2009 Mayer et al.
(Continued)

FOREIGN PATENT DOCUMENTS

DE            103 31 323 A1    2/2005
DE    10 2005 061 800 A1    6/2007
(Continued)

*Primary Examiner* — Thomas Dougherty
(74) *Attorney, Agent, or Firm* — McDermott Will & Emery LLP

(57) ABSTRACT

The present invention relates to an electroacoustic transducer which is arranged in an acoustic track (AS) and on a piezoelectric substrate (11) and which has two electrodes (1, 2) which are arranged on the substrate (11) and which have interengaging electrode fingers (3, 4) for exciting acoustic waves. The electrode fingers (3, 4) of an electrode (1, 2) are interconnected. The transducer also has means for increasing the mass occupation in a central excitation region (ZAB) which runs parallel to the acoustic track (AS), and the mass occupation in the central excitation region (ZAB) is higher than in an edge region (RB) which adjoins the central excitation region (ZAB) from both sides.

23 Claims, 11 Drawing Sheets

(51) Int. Cl.
*H03H 9/02* (2006.01)
*H03H 9/145* (2006.01)

(52) U.S. Cl.
CPC ......... *H03H 9/1457* (2013.01); *H03H 9/14532* (2013.01); *H03H 9/14552* (2013.01)

(56) References Cited

U.S. PATENT DOCUMENTS

| | | | |
|---|---|---|---|
| 7,576,471 | B1 | 8/2009 | Solal |
| 7,868,717 | B2 | 1/2011 | Mayer et al. |
| 7,939,989 | B2 | 5/2011 | Solal et al. |
| 2003/0117240 | A1 | 6/2003 | Inoue et al. |
| 2004/0096139 | A1 | 5/2004 | Abramov |
| 2004/0246076 | A1* | 12/2004 | Bergmann .................... 333/193 |
| 2007/0018755 | A1* | 1/2007 | Mayer et al. ................. 333/193 |
| 2009/0267707 | A1 | 10/2009 | Miura et al. |
| 2010/0219905 | A1 | 9/2010 | Nakamura et al. |
| 2012/0044027 | A1* | 2/2012 | Nakanishi et al. ............ 333/133 |
| 2013/0051588 | A1 | 2/2013 | Ruile et al. |
| 2013/0249647 | A1* | 9/2013 | Nakanishi et al. ............ 333/186 |

FOREIGN PATENT DOCUMENTS

| | | | | |
|---|---|---|---|---|
| DE | 10 2010 046 087 | A1 | 8/2011 | |
| EP | 0909026 | A2 | 4/1999 | |
| EP | 0935341 | A2 | 8/1999 | |
| EP | 1871006 | A1 | 12/2007 | |
| EP | 1962424 | A1 | 8/2008 | |
| EP | 2066026 | A1 | 6/2009 | |
| JP | 56043818 | A | 4/1981 | |
| JP | 56-149109 | A * | 11/1981 | ............ 310/340 |
| JP | 57162818 | A | 10/1982 | |
| JP | 06-066130 | | 6/1994 | |
| JP | 11-225038 | | 8/1999 | |
| JP | 2009-159039 | A | 7/2009 | |
| WO | WO-2010-137279 | A1 * | 2/2010 | ............ H03H 9/145 |
| WO | 2010/137279 | A1 | 12/2010 | |
| WO | 2011/088904 | A1 | 7/2011 | |

* cited by examiner

- State of the Technology -

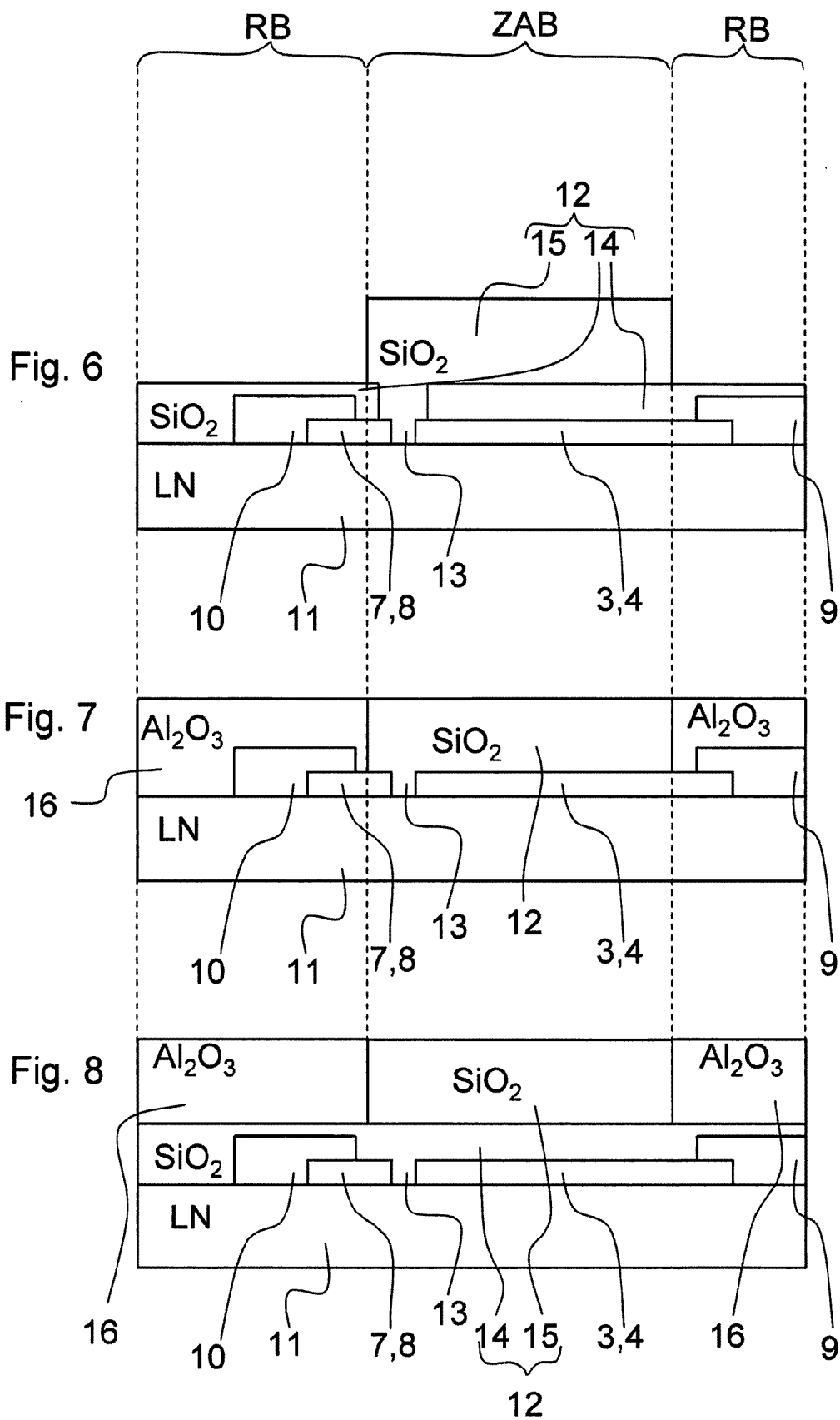

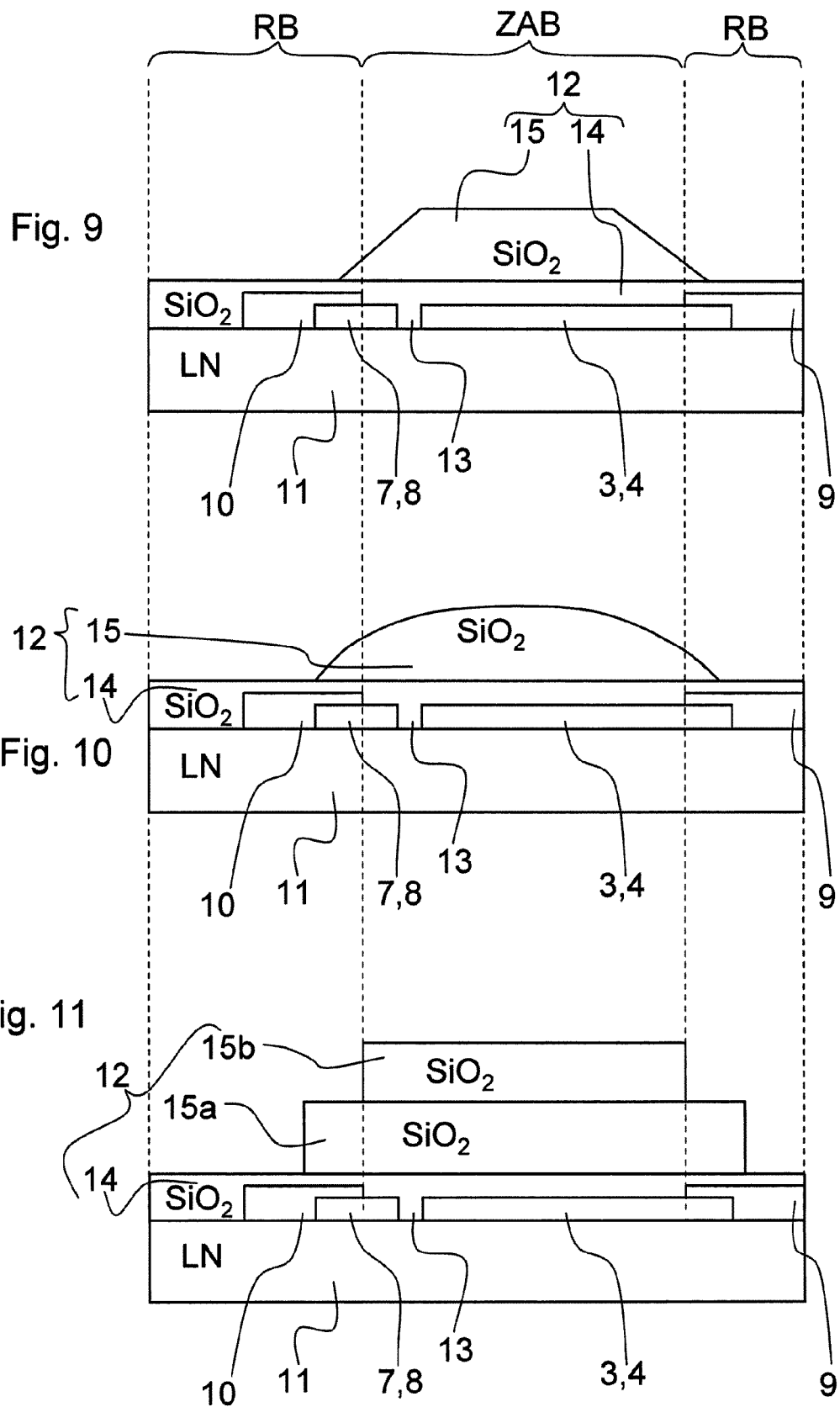

ELECTROACOUSTIC TRANSDUCER WITH REDUCED LOSSES DUE TO TRANSVERSE EMISSION AND IMPROVED PERFORMANCE DUE TO SUPPRESSION OF TRANSVERSE MODES

The invention relates to electroacoustic transducers which find application for example in an SAW or GBAW RF filter.

Components that operate with acoustic waves—e.g. surface acoustic waves (SAW) or guided bulk acoustic waves (GBAW)—convert RF signals into acoustic waves and conversely acoustic waves into RF signals. For this purpose, SAW or GBAW components comprise electrode fingers arranged on a piezoelectric substrate or on a piezoelectric layer. In a longitudinal direction, that is to say in the direction in which the acoustic waves propagate, electrode fingers are arranged alongside one another, which are generally connected alternately to a first and a second busbar. The acoustic track is that region of the substrate or of the piezoelectric layer in which surface acoustic waves propagate during the operation of the component. The electrode fingers lie in the acoustic track and thus in the acoustic region. The busbars lie in the lateral edge region of the acoustic track. In a longitudinal direction, the acoustic track is generally delimited by reflectors in order to reduce the energy loss due to emission of the acoustic wave in a longitudinal direction. The acoustic track can also be delimited by an acoustic sump.

One loss mechanism in the case of components that operate with acoustic waves consists in acoustic waves leaving the acoustic track in a longitudinal or transverse direction.

Due to the finite aperture of the acoustic tracks, transverse acoustic modes can arise due to diffraction effects. The transmission characteristic is impaired by the occurrence of different transverse modes. Spikes and dips can form in the transmission characteristic.

One important point in the development of components that operate with acoustic waves, in particular SAW filters for mobile radio applications, is to obtain components having low loss mechanisms and without disturbing transverse modes or with reduced disturbing transverse modes in conjunction with a good transmission characteristic.

The published patent application DE 10331323 A1 discloses a transducer which operates with SAWs and in which disturbing transverse modes are suppressed.

The patent specification U.S. Pat. No. 7,576,471 B1 discloses components which operate with SAWs and in which the thickness of the electrode fingers is increased in a region between a central excitation region and the region of the busbar. In this case, however, the application is restricted to so-called "weakly coupling" substrates. The electroacoustic coupling constant $k^2$ is a measure of the strength of the coupling between acoustic waves and signals.

Therefore, it is an object of the present invention to specify an electroacoustic transducer which has a good transmission characteristic and which is compatible with strongly coupling piezoelectric substrates. This object is achieved according to the invention by an electroacoustic transducer according to independent claim 1. Advantageous configurations are evident from the dependent claims.

The invention specifies an electroacoustic transducer arranged in an acoustic track. The transducer comprises a piezoelectric substrate and two electrodes arranged thereon and having intermeshing electrode fingers for the excitation of acoustic waves. The electrode fingers of an electrode are interconnected with one another. The transducer is designed such that the mass covering is higher in a central excitation region, which runs parallel to the acoustic track, than in a transverse edge region, which is adjacent to the central excitation region from both sides. For this purpose, the transducer has means for increasing the mass covering in the central excitation region.

The transducer is not restricted to weakly coupling substrates, but rather is also compatible with strongly coupling substrates.

According to the invention, the transducer is configured in such a way that the energy that leaves the transducer in a transverse direction is minimized. For this purpose, it is possible to suitably set the longitudinal velocities of the acoustic wave in different transverse regions. In this case, the propagation velocity of acoustic waves is generally reduced by a higher mass covering on the substrate. The term mass covering hereinafter denotes a relative mass covering per unit area. The velocity is generally increased by a covering with material of high stiffness. The choice of a suitable material for setting a desired mass covering therefore makes it possible both to increase and to decrease the propagation velocity of an acoustic wave. The transducer can now be configured in such a way that a transverse velocity profile is established in which the propagation velocity is lower in a central excitation region, which is parallel to the acoustic track, than in an edge region, which is adjacent to the central excitation region from both sides and parallel thereto. Such a velocity profile makes possible effective wave guiding. The emission of energy in a transverse direction is reduced on account of total reflection. This principle is known for optical waves for example through optical waveguides.

A transducer in which the longitudinal velocities of the acoustic wave in different transverse regions are set in such a way as to virtually preclude diffraction losses as a result of total reflection is distinguished by a high signal strength since almost no energy is emitted in a longitudinal direction.

However, said transducer usually has a multiplicity of transverse modes. These transverse modes usually have a dispersion, that is to say that each mode has a different propagation velocity and is therefore manifested at a specific frequency that is characteristic of the mode. As a result, the spectral purity is lost.

The transmission characteristic can be further improved by the transducer being configured in such a way that the transverse modes all have the same frequency and, furthermore, said frequency corresponds to the resonant frequency of the longitudinal mode. In this case, the transducer has a high spectral purity. The transverse modes are not suppressed, but rather contribute to the filter effect since they correspond to the resonant frequency of the transducer. The resonant frequencies of the transverse modes are likewise influenced by the mass covering of the transducer.

The transducer can have a dielectric layer, which at least partly covers the electrode fingers. In this embodiment, the electroacoustic transducer can be a GBAW component. If the piezoelectric layer is covered by a dielectric layer, for example $SiO_2$, then the propagation velocity of the acoustic wave is significantly lower in the dielectric layer than in the piezoelectric layer. A further layer can be arranged above the dielectric layer, wherein the propagation velocity of the acoustic wave is lower in the dielectric layer than in the further layer. Accordingly, a velocity profile fast-slow-fast is formed in a vertical direction, said profile avoiding loss in a vertical direction. On account of the small thickness of the dielectric layer, the aperture of this layer is very small, with the result that no disturbing transverse modes form or the frequencies of the transverse modes are very far apart, with the result that they do not disturb the transmission characteristic.

In one embodiment, the dielectric layer comprises silicon dioxide or completely consists thereof. $SiO_2$ is furthermore well suited to compensating for the temperature response of the elastic components of the substrate.

Situated opposite the electrode fingers of one electrode can be stub fingers of the other electrode. Said stub fingers are usually shorter than the electrode fingers. A gap is situated between the ends of the electrode fingers and the respectively opposite stub finger. A contact between electrode fingers and stub fingers has to be avoided since the transducer would otherwise be short-circuited. In the case of a transducer without overlap weighting, the stub fingers lie outside the acoustic track, that is to say no longer in the active transducer region.

The dielectric layer can now be configured in various ways. In one embodiment, the dielectric layer partly covers the electrode fingers and the stub fingers. In this embodiment, busbars that respectively interconnect the electrode fingers of an electrode with one another are not covered by the dielectric layer.

In a second embodiment, the electrode fingers, the gaps and the stub fingers are completely covered by the dielectric layer. The busbars are only partly covered by the dielectric layer. Preferably, here a region of the busbars which is adjacent to the inner region of the transducer in a transverse direction is covered by the dielectric layer.

In a third embodiment, the electrode fingers are covered by the dielectric layer only in the region in which the electrode fingers (3, 4) of the two electrodes (1, 2) overlap, while the stub fingers, the gaps between stub fingers and opposite electrode fingers and the busbar are not covered by the dielectric layer.

In a fourth embodiment, the electrode fingers in the region in which the electrode fingers (3, 4) of the two electrodes (1, 2) overlap and the gaps are completely covered by the dielectric layer and the stub fingers are covered by the dielectric layer in the form of a strip-shaped structure. In this case, strips in which the stub fingers are covered by the dielectric layer alternate with strips in which the stub fingers are not covered by the dielectric layer. The busbars can also be covered by the dielectric layer in the form of said strip-shaped structure. Preferably, only the regions of the busbars which are adjacent to the inner region of the transducer are covered by the dielectric layer applied in a strip-shaped fashion.

Dielectric material arranged on the electrode fingers makes it possible to set the velocity of the acoustic wave on account of the different mass covering. In one embodiment of the transducer, the dielectric material is arranged on and between electrode fingers. It is possible as it were to lay a strip, e.g. structured by means of lift-off technology or by means of etching technology, in a longitudinal direction over the electrode fingers. As a result, the mass covering and thus the longitudinal velocity can easily be set.

In a further embodiment of the present invention, the transverse cross-sectional profile of the dielectric layer is structured. Various structures are conceivable for this purpose, for instance a staircase-shaped structure, a trapezoidal structure or a structuring in the form of an ellipse segment.

Such a structuring allows the definition of transverse regions with different acoustic wave velocities.

In the case of a staircase-shaped structuring of the dielectric layer, it is appropriate to structure the different layers of the staircase with materials having a different mass covering. By way of example, the bottommost layer can be formed by a material having a mass covering that is smaller than the mass covering of the overlying layer. For this purpose, by way of example, sputtered silicon dioxide can be used for the bottommost layer and $SiO_2$ applied by means of a chemical vapor deposition can be used for the overlying layer. Generally, sputtered $SiO_2$ has a smaller mass covering than $SiO_2$ applied by means of a chemical vapor deposition. Preferably, the ends of the electrode fingers in this configuration are exposed in the bottommost dielectric layer. Accordingly, the ends of the electrode fingers are now covered by the overlying $SiO_2$ layer having a higher mass covering. The gap between electrode finger and opposite stub finger changes the velocity profile. If a larger mass covering is now used in the region of said gap, then the effect caused by the gap can be compensated for.

In one embodiment, a second dielectric layer is applied on said first dielectric layer. Preferably, the second dielectric layer has a smaller mass covering than the first dielectric layer. The first dielectric layer can be arranged in the central excitation region, and the rest of the transducer can be covered only by the second dielectric layer. If, by way of example, $SiO_2$ is used as first dielectric layer, then $Al_2O_3$ can be used as second dielectric layer.

The second dielectric layer can also be applied on a structured first dielectric layer. Thus, the first dielectric layer in the transverse profile can be structured for example in a staircase-shaped fashion, in a trapezoidal fashion or as an ellipse segment and is then subsequently covered by a second dielectric layer. In this case, a mass covering is likewise set, such that the mass covering is larger in the central excitation region than in the adjacent edge regions.

In a further embodiment of the present invention, the electrode fingers of an electrode are interconnected with one another by a metal layer rather than via a busbar. Preferably, said metal layer is arranged in the edge regions of the transducer and has a density that is lower than the density of the electrode fingers.

If a busbar composed of the same material as the electrode fingers is arranged in the outer regions of the transducer, then the busbar leads to a great increase in the mass covering into this outer region. In accordance with the configuration according to the invention, the busbar can be replaced by a metal layer which has a comparatively low density and accordingly only slightly increases the mass covering in the outer regions, such that a significantly higher mass covering is present in the central excitation region.

In a further embodiment of the present invention, the stub fingers can be greatly lengthened. If the electrode fingers were interconnected by means of a busbar in a conventional manner, then in this case the busbar would be arranged so far at the outer area that the transverse modes would already have decayed before the busbar, and the high mass covering by the busbar would no longer have an adverse influence on the mode. However, this arrangement has the disadvantage that the ohmic losses in the case of the feeding are very high as a result of the lengthened electrode fingers. It is therefore proposed as a countermeasure to arrange a further metal layer above the lengthened electrode fingers and stub fingers, which further metal layer, although on the one hand drastically reducing the ohmic losses, on the other hand does not entail a significant decrease in the propagation velocity of the GBAWs, in order thus still to avoid the extraction of the acoustic energy from the active transducer region. Accordingly, a metal that is not too heavy, preferably a light metal, such as, for example, Al or corresponding alloys, is chosen for the metal layer.

In order to further reduce the metallization in the outer regions, it is possible to vary the width of the electrode fingers in a transverse direction. In this case, a maximum width in the central excitation region is chosen, which decreases outwardly in a transverse direction. The change in the width of the electrode fingers can occur either in a stepped fashion or linearly. In an inner region, which substantially corresponds to the central excitation region and in which the electrode fingers of the two electrodes overlap, the electrode fingers are embodied as normal fingers. In an outer region, in which only the electrode fingers of an electrode are situated, the electrode fingers can be embodied as split fingers.

Electrodes or electrode fingers of a transducer can consist of a metal having a higher density than aluminum, e.g. of copper, gold, tungsten or an alloy of these metals, or comprise the latter as main constituent.

A dielectric compensation layer can be arranged on a transducer. The dielectric compensation layer can reduce or eliminate the temperature response of the frequency position of a component. Such a dielectric compensation layer can comprise $SiO_2$, $TeO_2$ or other dielectrics whose stiffness increases in the event of a temperature increase.

The invention is explained in greater detail below on the basis of exemplary embodiments and the associated figures. The figures show various exemplary embodiments of the invention on the basis of schematic illustrations which are not true to scale.

FIG. 1b shows a cross section of the transducer illustrated in FIG. 1a.

FIG. 2b shows a cross section of the transducer illustrated in FIG. 2a.

FIG. 3b shows a cross section of the transducer illustrated in FIG. 3a.

FIG. 4b shows a cross section of the transducer illustrated in FIG. 4a.

FIG. 5b shows a cross section of the transducer illustrated in FIG. 5a.

FIG. 6 shows a second embodiment of an electroacoustic transducer according to the present invention in cross section.

FIG. 7 shows a second variant of the second embodiment of an electroacoustic transducer according to the present invention in cross section.

FIG. 8 shows a third variant of the second embodiment of an electroacoustic transducer according to the present invention in cross section.

FIG. 9 shows a fourth variant of the second embodiment of an electroacoustic transducer according to the present invention in cross section.

FIG. 10 shows a fifth variant of the second embodiment of an electroacoustic transducer according to the present invention in cross section.

FIG. 11 shows a sixth variant of the second embodiment of an electroacoustic transducer according to the present invention in cross section.

Figure 1A:
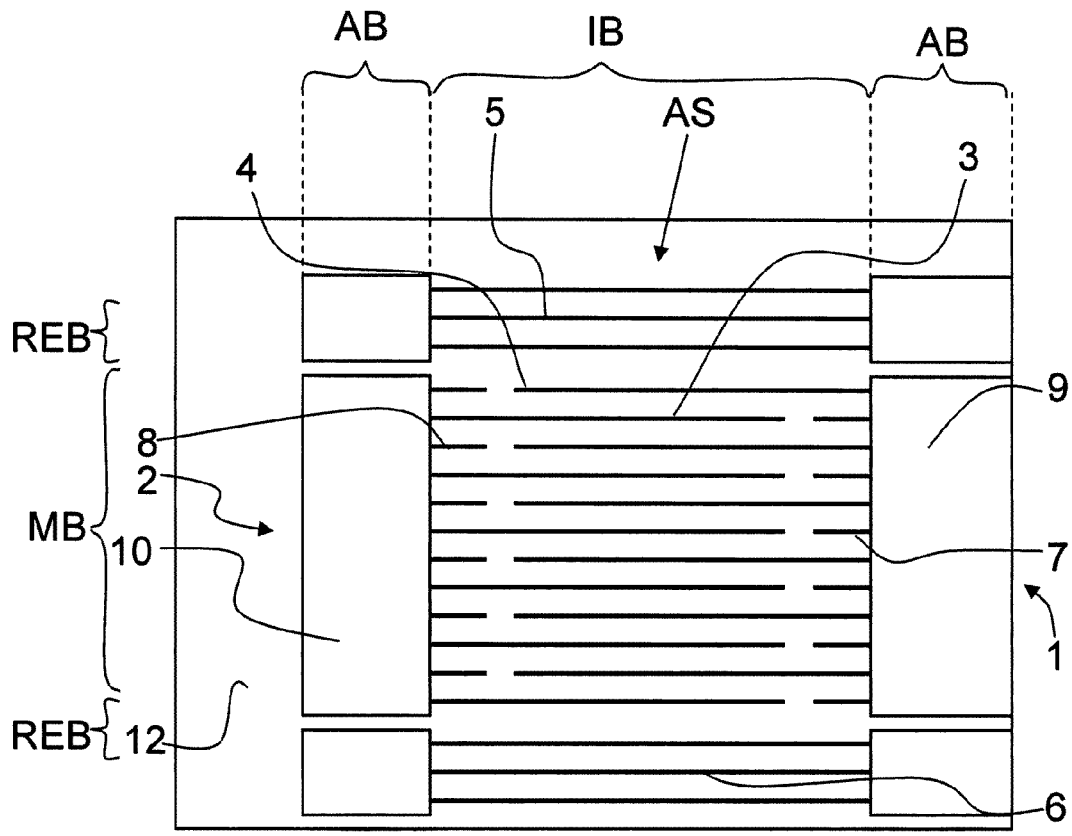
FIG. 1a shows an electroacoustic transducer known in the prior art in plan view.
Figure 1B:
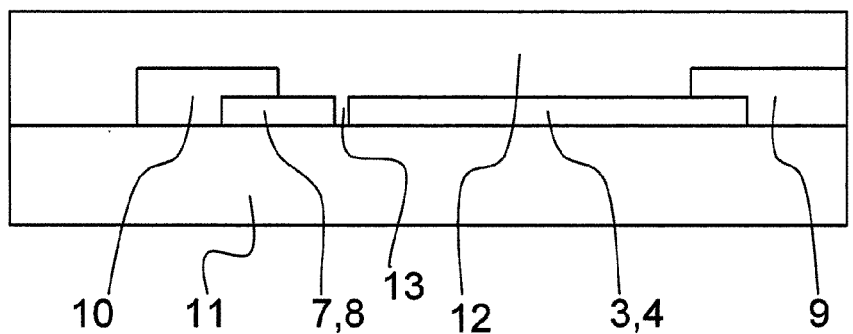

FIGS. 1a and 1b show a conventional electroacoustic transducer known in the prior art. FIG. 1a shows a plan view of the transducer. FIG. 1b shows a cross section of the same transducer.

The transducer comprises two electrodes 1, 2 having intermeshing electrode fingers 3, 4 for the excitation of acoustic waves. The transducer is arranged in an acoustic track AS. The acoustic waves are generated within said acoustic track AS. In a longitudinal direction, i.e. in the direction of the acoustic track AS, the transducer is divided into a central region MB and two reflector regions REB, wherein the two reflector regions REB are respectively adjacent to a side of the central region MB.

Continuous electrode fingers 5, 6 are arranged in the reflector regions REB of the transducer, said electrode fingers acting as reflectors and reflecting an acoustic wave back into the transducer. An electrode finger 3 interconnected with the first electrode 1 and an electrode finger 4 interconnected with the second electrode 2 are arranged in each case alternately in the central region MB of the transducer. By means of the alternately intermeshing electrode fingers 3, 4, an acoustic wave is excited in the central region MB.

Situated opposite the ends of the electrode fingers 3, 4 of one electrode 1, 2 are stub fingers 7, 8 interconnected with the other electrode 2, 1 in the central region MB of the transducer. The stub fingers 7, 8 have a significantly smaller length than the electrode fingers 3, 4. A respective gap 13 is situated between an electrode finger 3, 4 and the opposite stub finger.

The electrode fingers 3, 4 of an electrode 1, 2 are in each case interconnected with one another via a busbar 9, 10. The electrodes are arranged on a piezoelectric substrate 11, e.g. lithium niobate. The electrodes 1, 2 and the substrate 11 are covered by a dielectric layer 12, e.g. silicon dioxide.

In a transverse direction, i.e. perpendicularly to the acoustic track, the transducer is divided into an inner region and two outer regions AB, which are directly adjacent to the inner region IB. The inner region has the electrode fingers 3, 4, the gaps 13 and the stub fingers 7, 8. The outer regions AB have the busbar 9, 10.

The mass covering is virtually constant in the entire inner region IB. Only the gaps 13 between electrode fingers 3, 4 and stub fingers 7, 8 provide for local changes in the otherwise homogeneous mass covering in this region. Toward the outside, outer regions AB of the transducer are respectively adjacent to the inner region IB, the busbars 9, 10 being arranged in said outer regions.

In this conventional transducer, the busbars 9, 10 consist of the same material as the electrode fingers 3, 4. Therefore, the mass covering is maximal in the outer regions AB of the transducer. In regions having a high mass covering, the propagation velocity of the acoustic wave is reduced. Accordingly, the energy of the wave is concentrated into these regions. In a conventional transducer in accordance with FIG. 1, therefore, a large part of the energy would be extracted in a transverse direction into the outer regions.

Figure 2A:
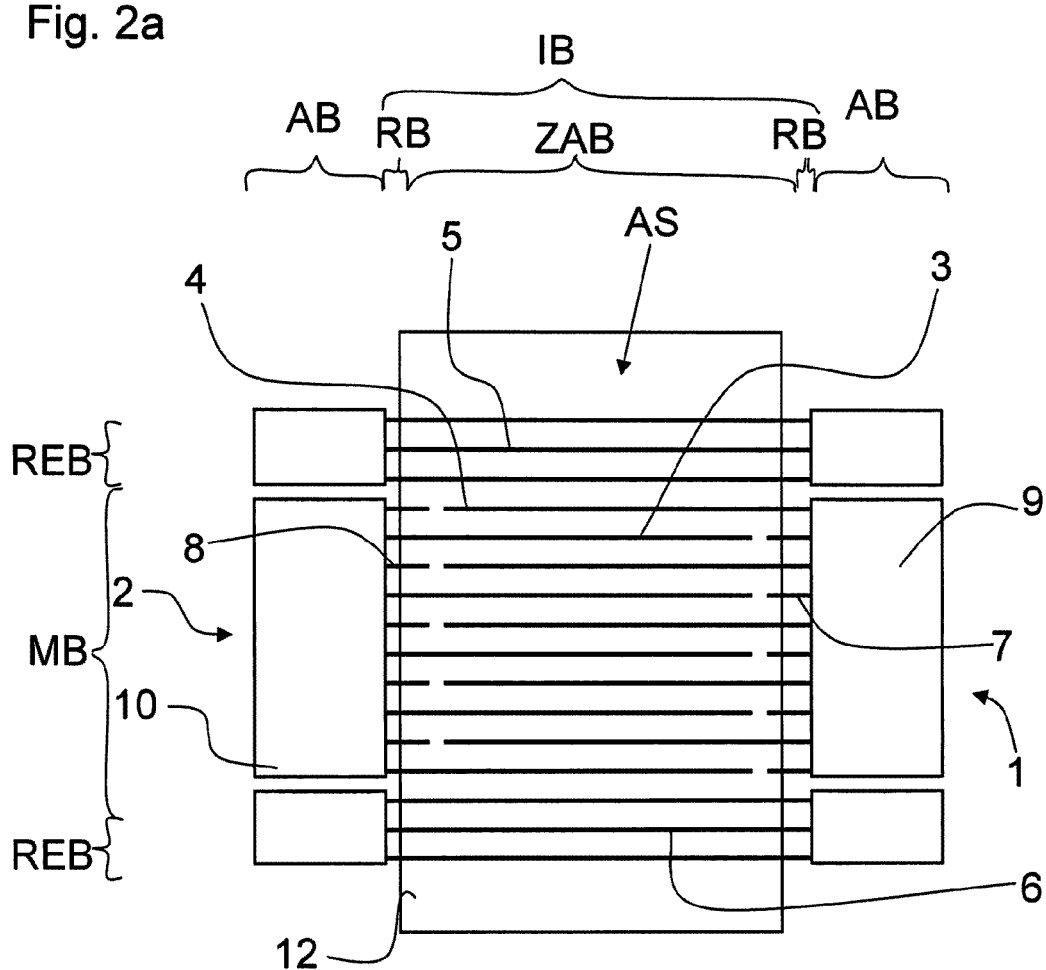
FIG. 2a shows an electroacoustic transducer in accordance with a first exemplary embodiment of the present invention in plan view.
Figure 2B:
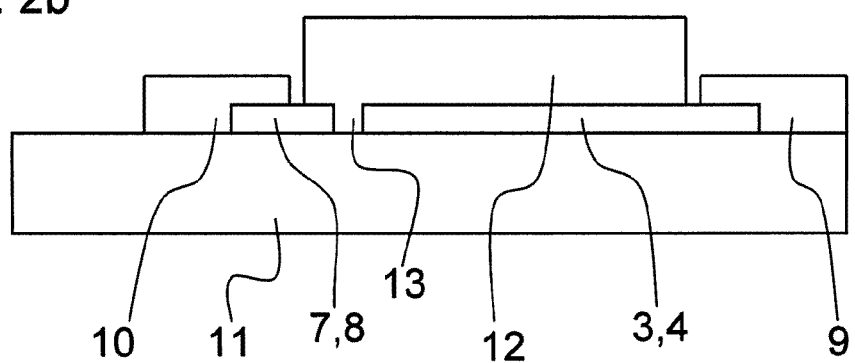

By contrast, FIG. 2a and FIG. 2b show a GBAW transducer in accordance with a first embodiment of the present invention. Here, the dielectric layer 12 is no longer applied over the whole area on the entire transducer. In a transverse direction, as a result the inner region IB is subdivided into a central excitation region ZAB, which runs parallel to the acoustic track AS, and edge regions RB, which are adjacent to the central excitation region ZAB from both sides. In the edge regions RB of the inner region IB, the transducer is not covered by a dielectric layer 12.

The boundary between the central excitation region ZAB, which is completely covered by the dielectric layer 12, and the edge region RB, which is free of the dielectric layer 12, lies in the region of the stub fingers 7, 8. Accordingly, the electrode fingers 3, 4 in the region of the overlap with the adjacent electrode finger and the gaps 13 are completely covered by the dielectric layer 12, whereas the stub fingers 7, 8 are only partly covered by the dielectric layer 12.

The outer region AB, which has the busbars 9, 10, is not covered by the dielectric layer 12.

In the case of a transducer in accordance with FIG. 2, the mass covering in the central excitation region ZAB is increased, while the mass covering in the edge regions RB and in the outer regions AB is smaller. The flowing-away of the energy into the outer regions AB can be reduced in this way.

Figure 3A:
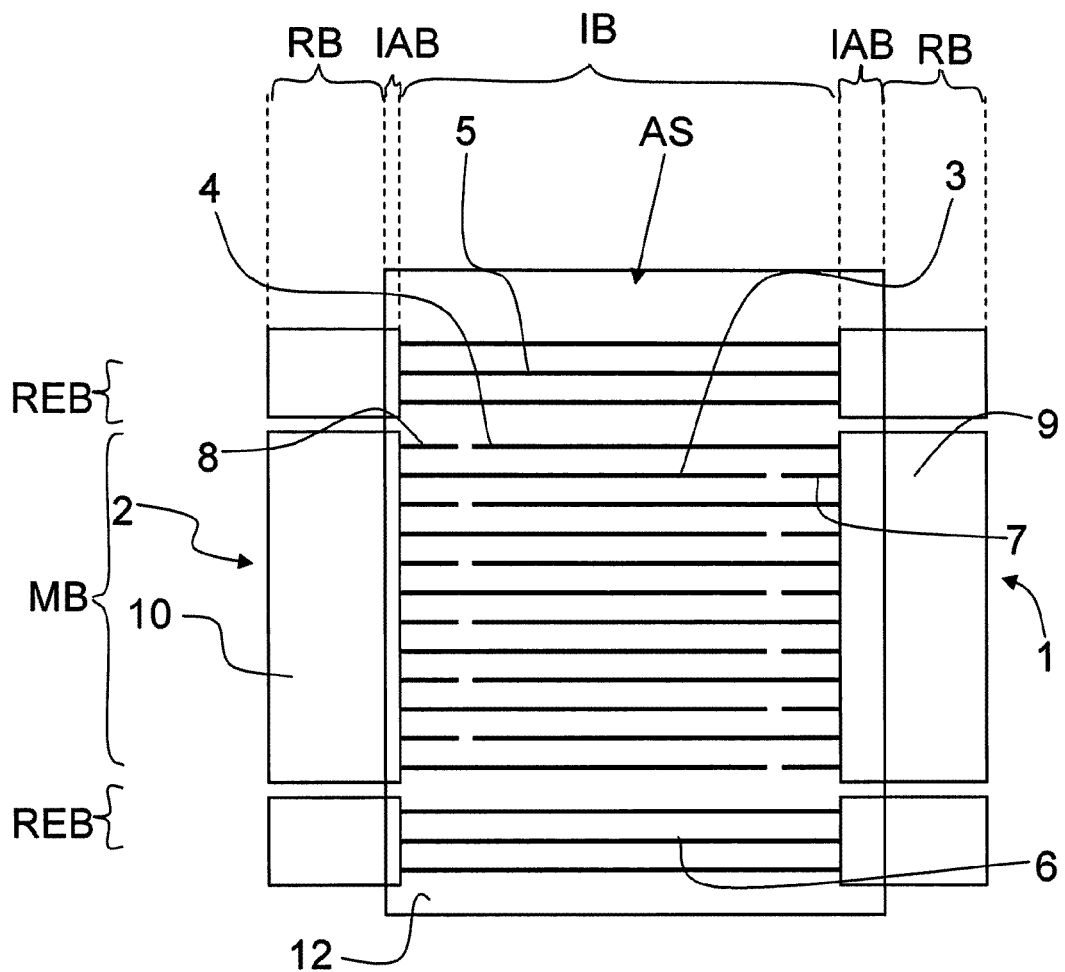
FIG. 3a shows a second variant of the first exemplary embodiment of the electroacoustic transducer according to the present invention in plan view.
Figure 3B:
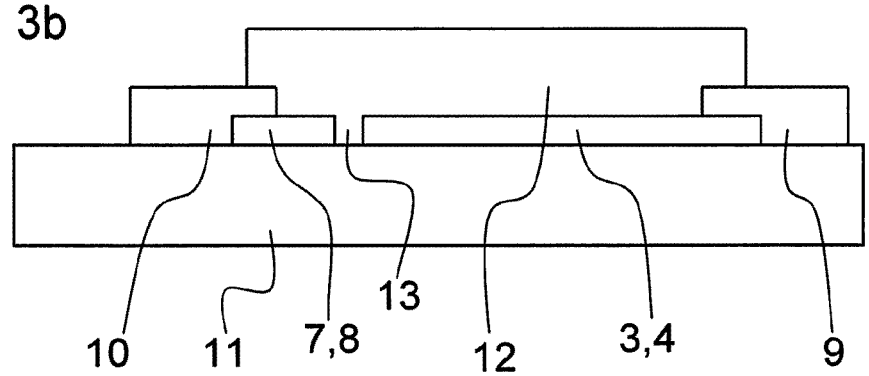

FIG. 3a and FIG. 3b show a second variant of the first embodiment. Here, the dielectric layer 12 extends just beyond the inner region IB and partly covers the busbars 9, 10. Accordingly, here the outer region AB is divided into an inner outer region IAB and an edge region RB. The mass covering in the edge region RB is reduced by comparison with the mass covering in the inner region IB and in the inner outer region IAB. The energy is thereby prevented from flowing away into the edge region RB.

Figure 4A:
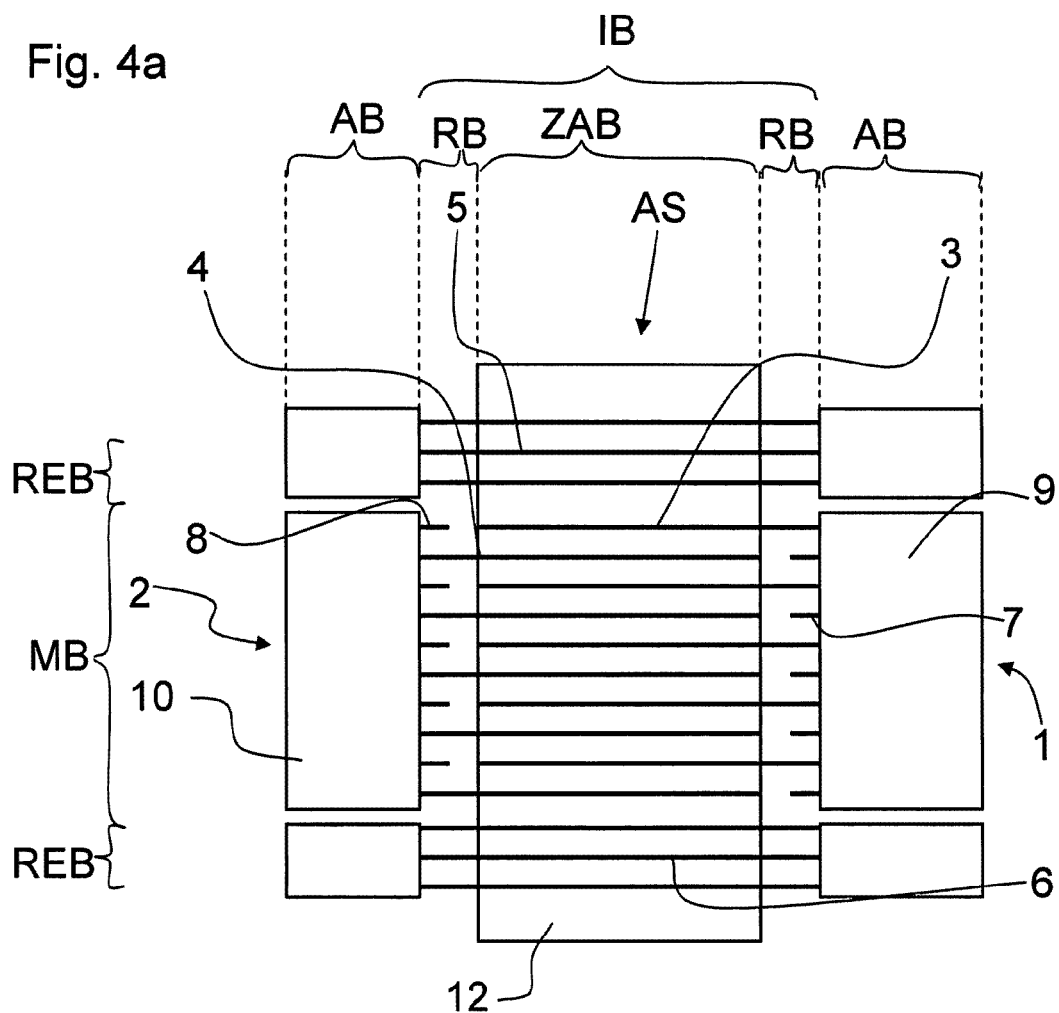
FIG. 4a shows a third variant of the first exemplary embodiment of the electroacoustic transducer according to the present invention in plan view.
Figure 4B:
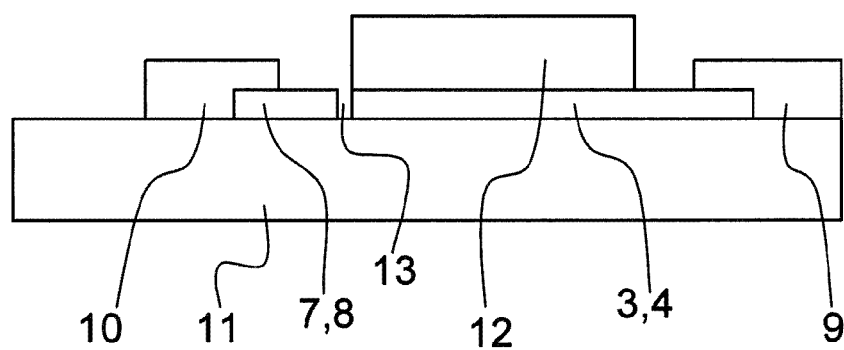

FIG. 4a and FIG. 4b show a third variant of the first embodiment of the GBAW transducer. Here, the dielectric layer 12 does not cover the stub fingers 7, 8 and the gaps 13. The central excitation region is completely covered by the dielectric layer 12. Accordingly, the inner region IB is divided into a central excitation region ZAB and edge regions RB, wherein the edge regions RB are adjacent to the central excitation region ZAB from the outer position.

Accordingly, now only the electrode fingers 3, 4 are covered by the dielectric layer 12. The dielectric layer 12 now increases the mass covering in the central excitation region ZAB, in which the electrode fingers 3, 4 of the opposite electrodes 1, 2 overlap transversely. In the adjoining edge regions RB, the mass covering is smaller than in the central excitation region ZAB.

The cross section of the transducer as illustrated in FIG. 4b clearly shows that the dielectric layer 12 terminates congruently with the end of the electrode fingers 3, 4.

Figure 5A:
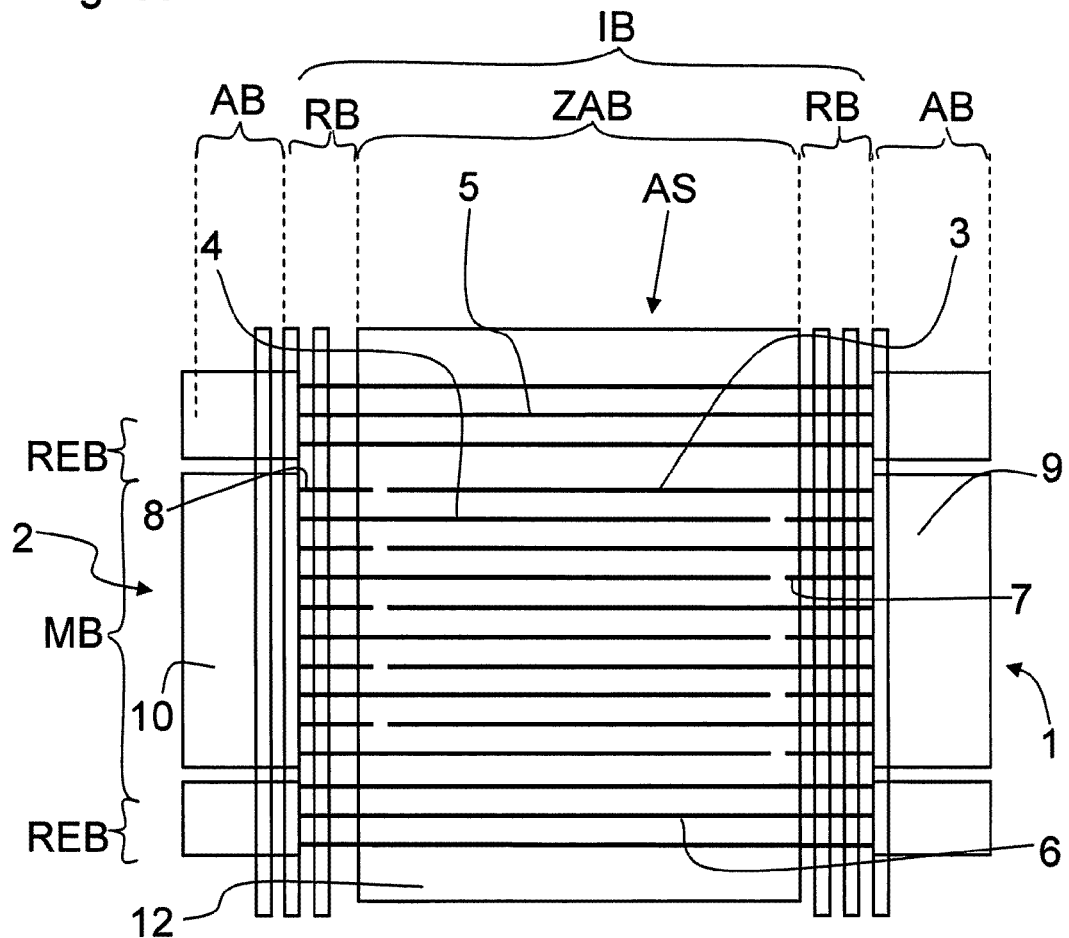
FIG. 5a shows a fourth variant of the first exemplary embodiment of an electroacoustic transducer according to the present invention in plan view.
Figure 5B:
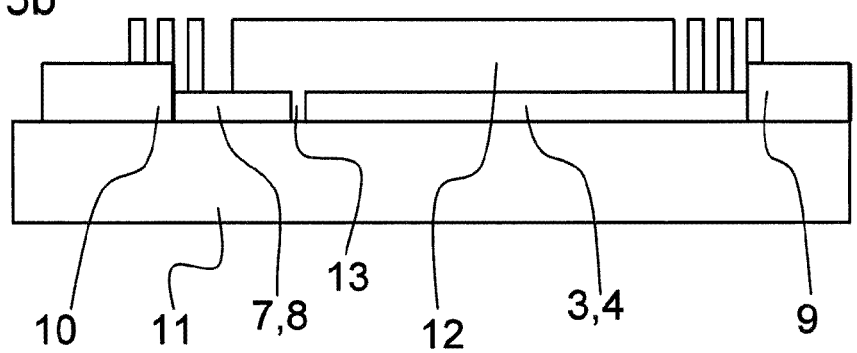

FIG. 5a and FIG. 5b show a fourth variant of the first embodiment of a GBAW transducer according to the present invention. This is a variant which is based on the embodiment shown in FIG. 2. The inner region IB of the transducer is once again subdivided into a central excitation region ZAB and edge regions RB, wherein the central excitation region ZAB comprises the electrode fingers 3, 4, the gaps 13 and partly the stub fingers 7, 8. The dielectric layer 12 completely covers the central excitation region ZAB.

In addition, a further region of the dielectric layer 12 covers the edge regions RB and the outer regions AB in the form of a strip-shaped structure. The stub fingers 3, 4 and the busbars 9, 10 are only partly covered by strips of the dielectric layer 12. Strips in which the dielectric layer 12 covers the stub fingers and the busbars 9, 10 in this case alternate with strips which are free of the dielectric layer 12.

This has the effect that the mass covering is larger in the central excitation region ZAB than in the adjoining edge regions RB.

FIG. 6 shows a second embodiment of the present invention. FIG. 6 illustrates a GBAW transducer in cross section. The transverse cross-sectional profile of the dielectric layer 12 was structured here in a staircase-shaped fashion. It has a lower layer 14, which covers the entire transducer. Furthermore, the dielectric layer 12 has an upper layer 15, which only partly covers the lower layer 14. In this case, the upper layer 15 is arranged in such a way that it covers that part of the lower layer 14 which in turn covers the central excitation region ZAB of the transducer. Lower layer 14 and upper layer 15 can comprise the same material or else be constructed differently.

By virtue of the staircase-shaped structuring of the transverse cross-sectional profile of the dielectric layer 12, the transducer is once again divided in a transverse direction into a central excitation region ZAB and edge regions RB adjacent thereto. The lower layer 14 and the upper layer 15 of the dielectric layer 12 are arranged above the central excitation region ZAB. The edge regions RB are covered only by the lower layer 14. Here, the central excitation region ZAB has the mutually overlapping electrode fingers 3, 4, the gaps 13 and partly the stub fingers 7, 8.

Preferably, the material of the lower layer 14 of the dielectric layer 12 has a smaller mass covering than the material of the upper layer 15. The material of the lower layer 14 is a sputtered silicon dioxide, for example. The upper layer 15 is $SiO_2$ applied by means of a chemical vapor deposition method, e.g. by plasma enhanced chemical vapor deposition (PECVD). $SiO_2$ applied by such a chemical vapor deposition method has a somewhat higher mass covering than sputtered $SiO_2$.

The lower dielectric layer 14 is removed in the region of the ends of the electrode fingers 3, 4. Accordingly, now the ends of the electrode fingers 3, 4 are covered by the upper dielectric layer 15. Since the upper dielectric layer 15 has a higher mass covering, the mass covering at the finger ends is increased. In this way, it is possible to compensate for the local changes in the acoustic propagation velocity of a wave through the gaps 13.

FIG. 7 shows a second variant of the second embodiment of the GBAW transducer. Here, too, the transverse cross-sectional profile of the dielectric layer 12 was structured. The dielectric layer 12 covers only the electrode fingers 3, 4, the gaps 13 and partly the stub fingers 7, 8 of the electrode. The busbars 9, 10 and the remaining regions of the transducer are initially free of the dielectric layer 12. Consequently, this part of the transducer illustrated in FIG. 7 corresponds to the transducer illustrated in FIG. 2.

In addition, the transducer has a second dielectric layer 16, which was applied in the regions left free of the first dielectric layer 12. The second dielectric layer can consist of $Al_2O_3$, for example. $Al_2O_3$ has a smaller mass covering than the material of the first dielectric layer 12, $SiO_2$. Once again, therefore, the transducer in accordance with FIG. 7 has a maximum mass covering in the central excitation region ZAB.

In the case of the transducer in accordance with FIG. 8, the first and second variants of the second embodiment of the present invention were combined with one another. The first dielectric layer 12 is structured in a staircase-shaped fashion here. It has a lower layer 14, which covers the entire transducer, and an upper layer 15, which covers only that region of the lower layer 14 which covers the central excitation region ZAB. The regions of the lower layer 14 of the first dielectric layer 12 which are not covered by the upper layer 15 are covered by the second dielectric layer 16, which has a smaller mass covering than the first layer 12.

FIGS. 9 to 11 exhibit further variants of the second embodiment of the GBAW transducer. In these figures, too, the dielectric layer 12 is constructed in a multilayered fashion. A bottommost layer 14 in each case covers the entire transducer. One or a plurality of layers 15, 15a, 15b applied thereabove cover only part of the transducer. This can be the central excitation region ZAB or the central excitation region ZAB and a part of the edge regions RB. The dielectric layers 15, 15a, 15b applied on the bottommost layer 14 are structured.

In the case of the transducers in accordance with FIGS. 9 to 11, it is furthermore possible to remove the bottommost dielectric layer 14 in the region of the gaps 13, in the manner as shown in connection with FIG. 6.

In the case of the transducer illustrated in FIG. 9, the upper layer 15 of the dielectric layer 12 is structured in a trapezoidal fashion. In the case of the transducer illustrated in FIG. 10, the upper layer 15 of the dielectric layer 12 is structured in the form of an ellipse segment. FIG. 11 shows a dielectric transducer, wherein the upper layer 15a, 15b of the dielectric layer 12 is structured in a staircase-shaped fashion. Generally, the dielectric layer 12 can be structured by means of lift-off methods or by means of suitable etching techniques. Dry- and wet-chemical methods and etching stop layer methods are known in the prior art.

Figure 12:
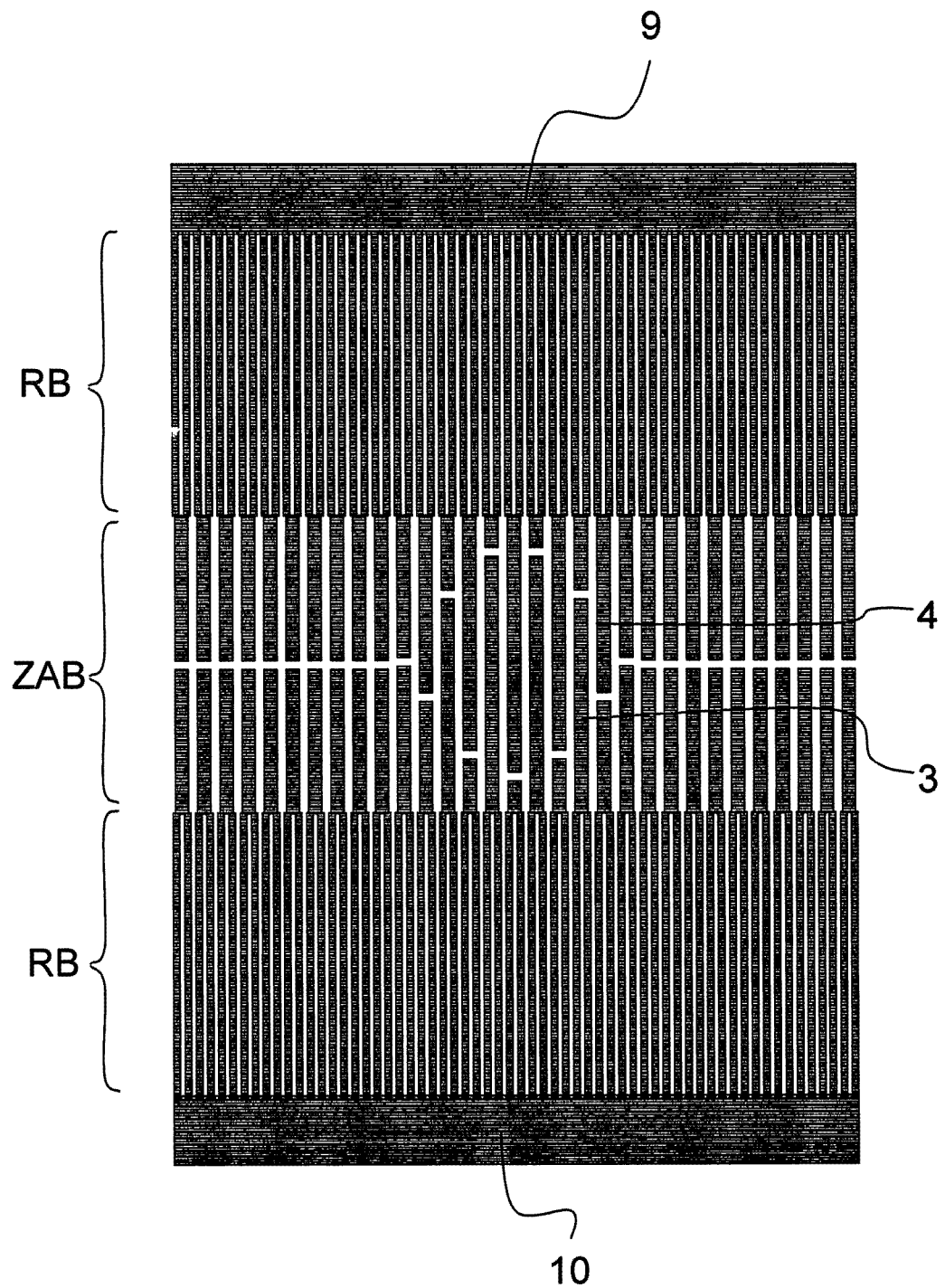
FIG. 12 shows the electrodes and the electrode fingers of a third embodiment of an electroacoustic transducer according to the present invention.

FIG. 12 shows the electrodes of a GBAW transducer in accordance with a third embodiment of the present invention. The electrode fingers 3, 4 of this transducer are very elongate. They divide into a central excitation region ZAB and an edge region RB. The electrode fingers 3, 4 of two opposite electrodes overlap in the central excitation region ZAB. Only the electrode fingers 3, 4 of one electrode are respectively situated in the edge region RB.

In order to ensure good wave guiding of the acoustic wave, energy of the acoustic wave should be prevented from being emitted in a transverse direction. For this purpose, the mass covering in the central excitation region ZAB is increased or the mass covering in the edge region RB is reduced. Accordingly, the width of the electrode fingers 3, 4 in the edge region RB is reduced. FIG. 12 shows an electroacoustic transducer wherein the electrode fingers are configured as split fingers in the edge region RB.

The electrode fingers 3, 4 of an electrode are here respectively interconnected with a busbar 9, 10. The busbars 9, 10 are produced from the same material as the electrode fingers 3, 4. Accordingly, the regions in which the busbars 9, 10 are arranged have a very high mass covering. In accordance with a fourth embodiment, the busbars 9, 10 can be replaced by a metal layer. Accordingly, the electrode fingers 3, 4 of an electrode are interconnected with one another by said metal layer, which can be applied below, but preferably above, the metallization of the electrode fingers. For this purpose, a metal layer is in each case applied in the edge regions RB. Said metal layer has a lower density than the material of the electrode fingers. Therefore, the mass covering in the edge regions RB is increased only slightly by the metal layer.

Figure 13:
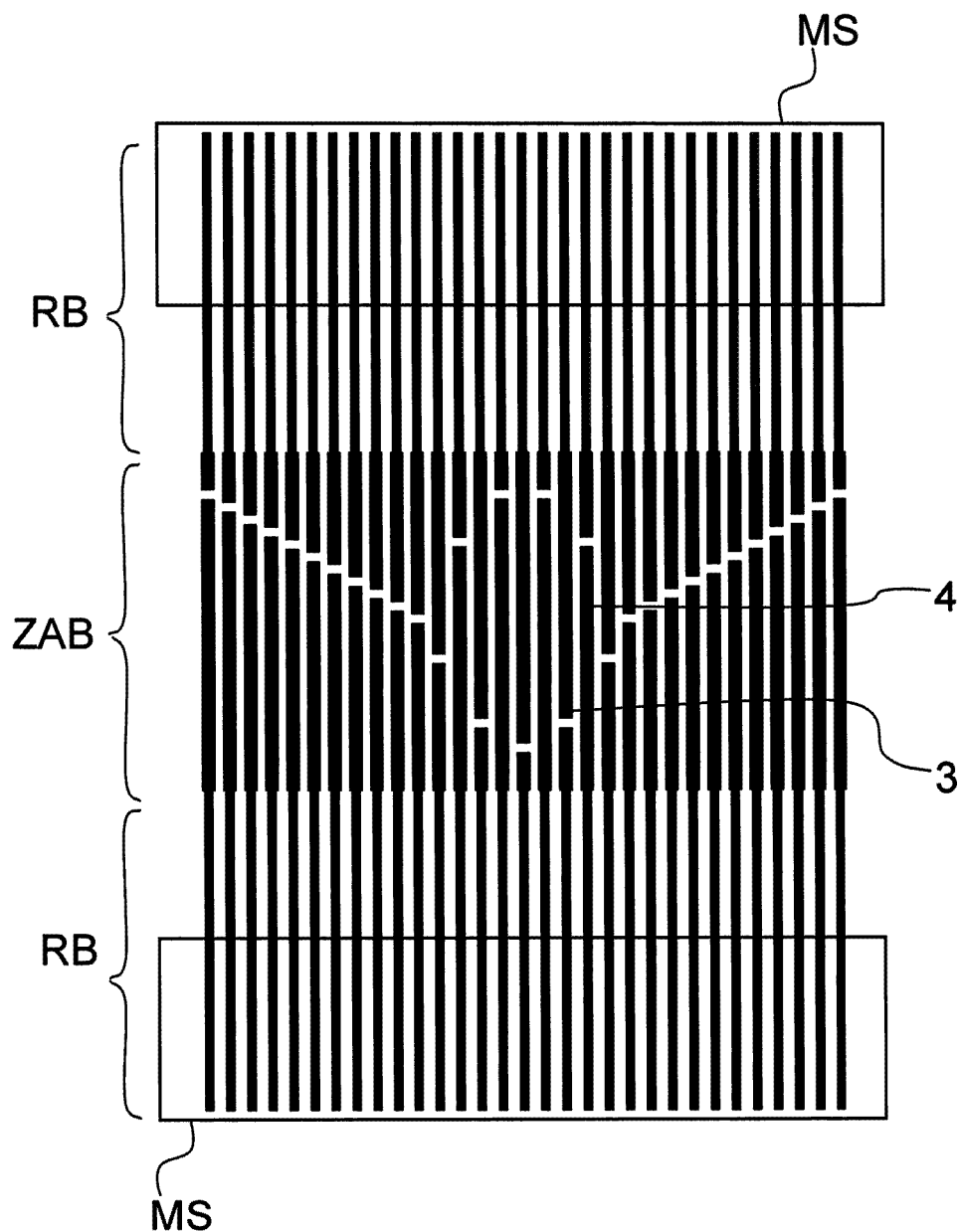
FIG. 13 shows the electrode fingers of a fourth embodiment of an electroacoustic transducer according to the present invention.

FIG. 13 shows a schematic illustration of the electrode fingers 3, 4 of a transducer in which, instead of a busbar 9, 10, a metal layer MS is used in order to interconnect the electrode fingers 3, 4 of an electrode with one another. In the case of the transducer in accordance with FIG. 13, the widths of the electrode fingers 3, 4 in the edge regions RB are reduced by comparison with the width of the electrode fingers in the central excitation region ZAB. The change in the width of the electrode fingers 3, 4 takes place here in a stepped fashion with one step. However, the width can also be multiply stepped.

Figure 14:
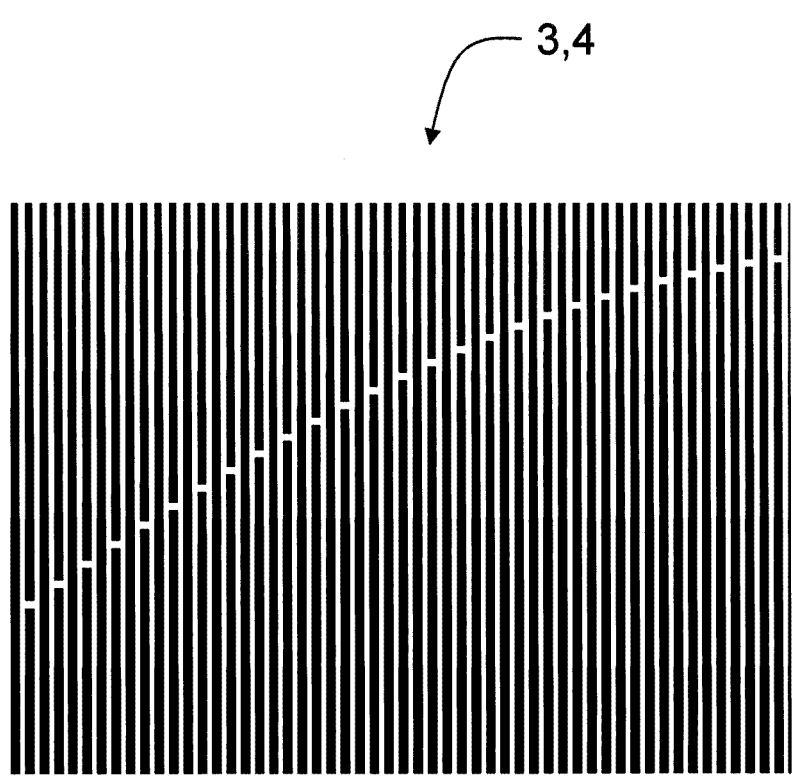
FIG. 14 shows an excerpt from the electrode fingers of an electroacoustic transducer in accordance with a second variant of the fourth embodiment.

FIG. 14 shows a second variant of the fourth embodiment. Only an excerpt from the electrode fingers 3, 4 of a transducer is shown here. It can be gathered from FIG. 14 that the width of the electrode finger 3, 4 decreases linearly from the inner area outward.

All variants of the four embodiments of the transducer can be combined with one another in any desired manner. Thus, by way of example, a transducer having an electrode finger width that varies in a transverse direction can have a structured dielectric layer, as shown in FIGS. 2 to 11. Furthermore, in the case of such a transducer, the electrode fingers of an electrode can be interconnected with one another by means of a light metal layer MS, instead of by means of a busbar.

Figure 15:
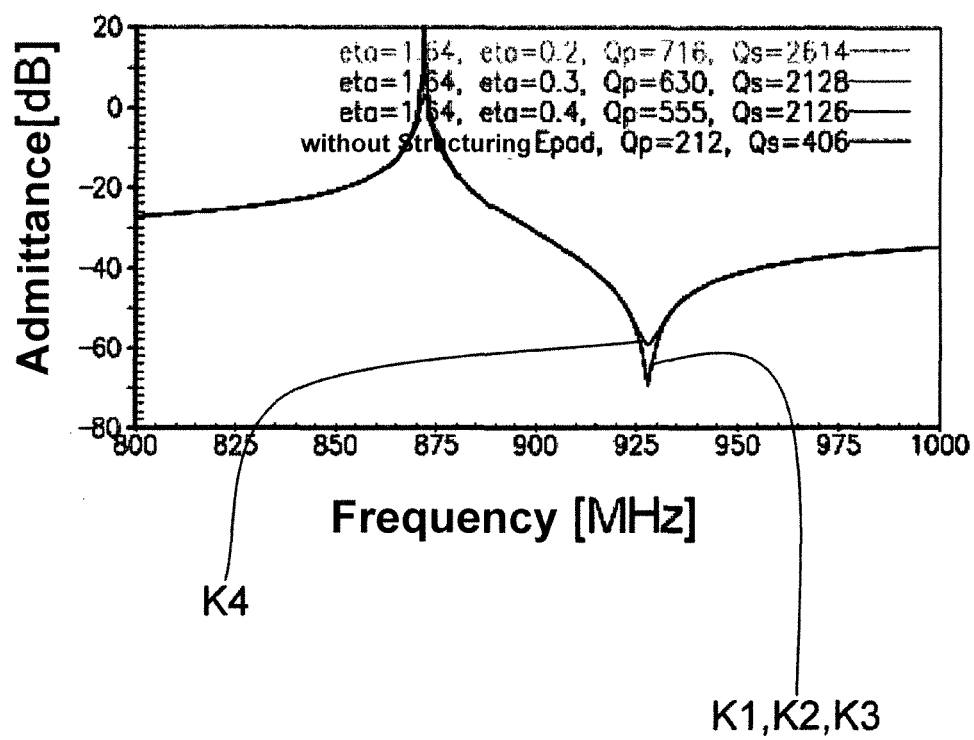
FIG. 15 shows simulations of the admittance for different configurations of the outer region in accordance with the third, fourth or fifth embodiment of the GBAW transducer.

FIG. 15 shows the admittance for various embodiments. Curves K1 to K4 describe the admittance for various transducers. Curves K1 to K3 indicate the admittance for a transducer in accordance with the exemplary embodiment shown in FIG. 13. Here, the stub fingers 7, 8 in the edge regions RB are thinner than the electrode fingers 3, 4 in the central excitation region ZAB. The metallization $\eta$ indicates the ratio of the finger width to the period of the transducer. In the central excitation region ZAB, the metallization $\eta$ is 0.6. Curve K1 describes the admittance for a transducer in which the metallization $\eta$ in the edge region RB is 0.2. Curves K2 and K3 indicate the metallization $\eta$ for transducers having a metallization $\eta$ of 0.3 and 0.4, respectively, in the edge regions RB. Curve K4 shows the metallization $\eta$ for a transducer in which the finger width in the edge regions RB is not reduced. Accordingly, the metallization $\eta$ in the edge regions RB, just as in the central excitation region ZAB, is 0.6.

The more pronounced the resonance and the antiresonance of the admittance curve K1 to K4, the higher the quality factor of the corresponding transducer. FIG. 15 shows that the admittance curves K1 to K3, which describe transducers having a reduced stub finger width in the edge regions RB, have a virtually congruent profile and have a very distinctly pronounced resonance at 875 MHz and a likewise very highly pronounced antiresonance at 925 MHz. In the case of curve K4, which describes a transducer having identical widths of the electrode fingers 3, 4 and of the stub fingers 7, 8, by contrast, the resonance and the antiresonance are distinctly flattened. Accordingly, FIG. 15 shows that the quality factor of a transducer can be increased by reducing the width of the stub fingers 7, 8 in the edge regions RB.

The invention claimed is:

1. An electroacoustic transducer, arranged in an acoustic track, on a piezoelectric substrate, the electroacoustic transducer comprising:
    two electrodes arranged on the substrate and having intermeshing electrode fingers for the excitation of acoustic waves,
    wherein the electrode fingers of an electrode are interconnected with one another,
    wherein the mass covering is higher in the central excitation region which runs parallel to the acoustic track than in an edge region adjacent to the central excitation region from both sides,
    wherein the transducer has a dielectric layer, which at least partly covers the electrode fingers,
    wherein situated opposite the free ends of the electrode fingers of one electrode are stub fingers interconnected with the other electrode, and
    wherein the dielectric layer partly covers the electrode fingers and the stub fingers.

2. The electroacoustic transducer according to claim 1, wherein situated opposite the ends of the electrode fingers of one electrode are stub fingers interconnected with the other electrode, the dielectric layer covers the electrode fingers in the region in which the electrode fingers of the two electrodes overlap, and the stub fingers and the gaps between the stub fingers and the opposite electrode fingers are not covered by the dielectric layer.

3. The electroacoustic transducer according to claim 1, wherein situated opposite the ends of the electrode fingers of one electrode are stub fingers interconnected with the other electrode, and the dielectric layer covers the electrode fingers in the region in which the electrode fingers of the two electrodes overlap, and the gaps between the stub fingers and the opposite electrode fingers, and covers the stub fingers in a strip-shaped structure, wherein strips in which the stub fingers are covered by the dielectric layer and strips in which the stub fingers are free of the dielectric layer alternate.

4. The electroacoustic transducer according to claim 1, wherein situated opposite the ends of the electrode fingers of one electrode are stub fingers interconnected with the other electrode,
wherein the electrode fingers of an electrode are respectively interconnected with a busbar, and
wherein the dielectric layer completely covers the stub fingers and the electrode fingers and partly covers the busbars.

5. The electroacoustic transducer according to one of claims 1 and 2-4, wherein the transverse cross-sectional profile of the dielectric layer is structured.

6. The electroacoustic transducer according to claim 5, wherein a bottommost layer of the dielectric layer completely covers the transducer and an overlying layer partly covers the bottommost layer.

7. The electroacoustic transducer according to claim 6, wherein the bottommost layer of the dielectric layer has a smaller mass covering per unit area than the overlying layer.

8. The electroacoustic transducer according to claim 7, wherein the bottommost layer of the dielectric layer is exposed above the ends of the electrode fingers.

9. The electroacoustic transducer according to claim 7, wherein the bottommost layer of the dielectric layer comprises sputtered silicon dioxide and the overlying layer comprises silicon dioxide applied by means of a chemical vapor deposition.

10. The electroacoustic transducer according to claim 5, wherein the transverse cross-sectional profile of the dielectric layer or a layer of the transverse cross-sectional profile that lies above the bottommost layer is structured in a staircase-shaped fashion, in a trapezoidal fashion or in the form of an ellipse segment.

11. The electroacoustic transducer according to claim 1, wherein the central excitation region is covered by a first dielectric layer and the rest of the transducer is covered by a second dielectric layer, which has a smaller mass covering than the first dielectric layer.

12. The electroacoustic transducer according to claim 1, which is a GBAW component.

13. The electroacoustic transducer according to claim 1, which has a metal layer arranged in the edge regions, wherein the electrode fingers of an electrode are in each case electrically contact-connected to one another by the metal layer.

14. The electroacoustic transducer according to claim 13, wherein the density of the metal layer is lower than the density of the electrode fingers.

15. The electroacoustic transducer according to claim 1, wherein the electrode fingers are embodied as normal fingers in a central excitation region, in which the electrode fingers of the two electrodes overlap, and
wherein the electrode fingers are embodied as split fingers in an edge region, in which only the electrode fingers of one electrode are situated.

16. The electroacoustic transducer according to claim 1, wherein the width of the electrode fingers varies in a transverse direction.

17. The electroacoustic transducer according to claim 16, wherein the width of the electrode fingers is maximal in the finger center and decreases outwardly.

18. The electroacoustic transducer according to claim 1, which is configured in such a way that the frequencies of the transverse oscillation modes correspond to the frequency of the longitudinal oscillation mode of the acoustic wave.

19. An electroacoustic transducer, arranged in an acoustic track, on a piezoelectric substrate, the electroacoustic transducer comprising:
two electrodes arranged on the substrate and having intermeshing electrode fingers for the excitation of acoustic waves,
wherein the electrode fingers of an electrode are interconnected with one another,
wherein the mass covering is higher in the central excitation region which runs parallel to the acoustic track than in an edge region adjacent to the central excitation region from both sides,
wherein the transducer has a dielectric layer, which at least partly covers the electrode fingers, and
wherein situated opposite the ends of the electrode fingers of one electrode are stub fingers interconnected with the other electrode, the dielectric layer covers the electrode fingers in the region in which the electrode fingers of the two electrodes overlap, and the stub fingers and the gaps between the stub fingers and the opposite electrode fingers are not covered by the dielectric layer.

20. An electroacoustic transducer, arranged in an acoustic track, on a piezoelectric substrate, the electroacoustic transducer comprising:
two electrodes arranged on the substrate and having intermeshing electrode fingers for the excitation of acoustic waves,
wherein the electrode fingers of an electrode are interconnected with one another,
wherein the mass covering is higher in the central excitation region which runs parallel to the acoustic track than in an edge region adjacent to the central excitation region from both sides,
wherein the transducer has a dielectric layer, which at least partly covers the electrode fingers,
wherein situated opposite the ends of the electrode fingers of one electrode are stub fingers interconnected with the other electrode, and the dielectric layer covers the electrode fingers in the region in which the electrode fingers of the two electrodes overlap, and the gaps between the stub fingers and the opposite electrode fingers, and covers the stub fingers in a strip-shaped structure, and
wherein strips in which the stub fingers are covered by the dielectric layer and strips in which the stub fingers are free of the dielectric layer alternate.

21. An electroacoustic transducer, arranged in an acoustic track, on a piezoelectric substrate, the electroacoustic transducer comprising:
two electrodes arranged on the substrate and having intermeshing electrode fingers for the excitation of acoustic waves, wherein the electrode fingers of an electrode are interconnected with one another, wherein the mass covering is higher in the central excitation region which runs parallel to the acoustic track than in an edge region adjacent to the central excitation region from both sides, wherein the transducer has a dielectric layer, which at least partly covers the electrode fingers, wherein situated opposite the ends of the electrode fingers of one electrode are stub fingers interconnected with the other electrode, wherein the electrode fingers of an electrode are respectively interconnected with a busbar, and wherein the dielectric layer completely covers the stub fingers and the electrode fingers and partly covers the busbars.

22. An electroacoustic transducer, arranged in an acoustic track, on a piezoelectric substrate, the electroacoustic transducer comprising:

two electrodes arranged on the substrate and having intermeshing electrode fingers for the excitation of acoustic waves, wherein the electrode fingers of an electrode are interconnected with one another, and wherein the mass covering is higher in the central excitation region which runs parallel to the acoustic track than in an edge region adjacent to the central excitation region from both sides; and a metal layer arranged in the edge regions, wherein the electrode fingers of an electrode are in each case electrically contact-connected to one another by the metal layer, and wherein the density of the metal layer is lower than the density of the electrode fingers.

23. An electroacoustic transducer, arranged in an acoustic track, on a piezoelectric substrate, the electroacoustic transducer comprising:

two electrodes arranged on the substrate and having intermeshing electrode fingers for the excitation of acoustic waves, wherein the electrode fingers of an electrode are interconnected with one another, wherein the mass covering is higher in the central excitation region which runs parallel to the acoustic track than in an edge region adjacent to the central excitation region from both sides, wherein the electrode fingers are embodied as normal fingers in a central excitation region, in which the electrode fingers of the two electrodes overlap, and wherein the electrode fingers are embodied as split fingers in an edge region, in which only the electrode fingers of one electrode are situated.

* * * * *